(12) United States Patent
Aihara et al.

(10) Patent No.: US 6,264,906 B1
(45) Date of Patent: Jul. 24, 2001

(54) METHOD FOR HEAT TREATMENT OF SILICON SUBSTRATE, SUBSTRATE TREATED BY THE METHOD, AND EPITAXIAL WAFER UTILIZING THE SUBSTRATE

(75) Inventors: Ken Aihara; Hiroshi Takeno, both of Gunma-ken (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/648,180

(22) Filed: Aug. 25, 2000

Related U.S. Application Data (62) Division of application No. 09/345,098, filed on Jun. 30, 1999, now Pat. No. 6,143,071.

(30) Foreign Application Priority Data

Jul. 7, 1998 (JP) .................................. 10-208712

(51) Int. Cl.[7] .................................. C01B 33/26
(52) U.S. Cl. .................................. 423/328.2
(58) Field of Search .................................. 423/328.2

(56) References Cited

U.S. PATENT DOCUMENTS 4,943,558  7/1990  Soltis et al. .................. 505/1
5,279,973  1/1994  Suizu .......................... 438/795

FOREIGN PATENT DOCUMENTS

377330  4/1991  (JP) .................. H01L/21/322

*Primary Examiner*—Felisa Hiteshew
(74) *Attorney, Agent, or Firm*—Hogan & Hartson, L.L.P

(57) ABSTRACT

There is disclosed a method for heat treatment of a silicon substrate produced by the CZ method by utilizing a rapid thermal annealer, wherein the heat treatment is performed under an atmosphere composed of 100% nitrogen, or 100% oxygen, or a mixed atmosphere of oxygen and nitrogen by heating the silicon substrate to a maximum holding temperature within a range of from 1125° C. to the melting point of silicon, and holding the substrate at that maximum holding temperature for a holding time of 5 seconds or more, and then the substrate is rapidly cooled at a cooling rate of 8° C./second or more from the maximum holding temperature. In the method, the amount of oxygen precipitation nuclei in the substrate can be controlled by changing the maximum holding temperature and the holding time. The present invention provide a method for heat treatment of a silicon substrate produced by the CZ method by utilizing an RTA apparatus, which can provide a silicon substrate having a desired oxygen precipitation characteristic without controlling oxygen concentration in the silicon substrate, and an epitaxial wafer utilizing a substrate heat-treated by the method.

1 Claim, 4 Drawing Sheets

HEAT TREATMENT TIME (SECOND)
AND ATMOSPHERIC GAS

METHOD FOR HEAT TREATMENT OF SILICON SUBSTRATE, SUBSTRATE TREATED BY THE METHOD, AND EPITAXIAL WAFER UTILIZING THE SUBSTRATE

This is a divisional of application Ser. No. 09/345,098 filed Jun. 30, 1999 now U.S. Pat. No. 6,143,071, which application is hereby incorporated by reference in its entirety.

BACKGROUND OF THE INVENTION

1. Field of the Invention

The present invention relates to a method for heat treatment of a silicon substrate produced by the Czochralski method (CZ method), and an epitaxial wafer produced by using a substrate heat-treated by the method. In particular, it relates to a method for heat treatment for obtaining a semiconductor substrate imparted with internal gettering ability through a high temperature heat treatment in a short period of time.

2. Description of Related Art

Silicon crystals produced by the CZ method contain not a little oxygen, because a crucible made of quartz is used for the production. It has been known that this oxygen forms precipitates during the production of the crystals and the heat treatment in the device fabrication process after slicing and substrate processing of the crystals.

When the oxide precipitates are in the device active regions, they may be a cause of degradation of device yield. On the other hand, the oxide precipitates formed in the inside of substrates afford an effect for improving gettering ability for heavy metal contamination species. From these points of view, it is extremely important to control the amount of oxide precipitates in a silicon substrate (control of oxygen precipitation characteristic).

The control of this oxygen precipitation characteristic has conventionally been achieved by controlling the crystal oxygen concentration during the production of silicon crystals, or by subjecting the substrates to a heat treatment for a long period of time.

However, the former type control requires establishment of crystal production conditions for a desired oxygen concentration. Therefore, the production operation becomes complicated, and in addition the accuracy is bad. Further, even though a crystal have a constant oxygen concentration along the crystal growth direction, the oxygen precipitation characteristic along the growth axis direction is not necessarily uniform due to influence of the thermal history during the crystal production. To obtain uniform oxygen precipitation characteristic, heat treatment of long period of time is required, and hence the productivity becomes low.

To overcome the above situation, the method disclosed in Japanese Patent Application Laid-open (KOKAI) No. 3-77330 aims at eliminating the influence of the thermal history during the crystal growth, and obtaining a constant amount of precipitated oxygen without differently controlling the oxygen concentration for every substrate by forming an oxide film having a thickness of 100 angstrom (Å) or more on a silicon substrate surface, then heat-treating the substrate at a temperature of from 1170° C. to 1300° C. in nitrogen gas atmosphere, cooling it at a cooling rate not less than 100° C./minute, and then performing heat treatment for oxygen precipitation.

On the other hand, as for an epitaxial wafer manufactured by using a silicon substrate produced by the CZ method, when epitaxial growth is performed using a silicon substrate having a usual resistivity, potential oxygen precipitation nuclei formed during the substrate production (crystal production) are eliminated by the high temperature heat treatment in the epitaxial growth step, and thus the gettering effect for metal impurities may be lost. Insufficient gettering effect degrades the yield in the device processing step.

Further, the amount of precipitated oxygen may vary depending on the oxygen concentration of silicon substrates and thermal history during the crystal production. For example, when substrates having different initial oxygen concentrations are used, the amounts of precipitated oxygen vary, and hence different gettering abilities are resulted. In particular, a wafer of low oxygen concentration affords a low amount of precipitated oxygen. Therefore, to maintain stable gettering effect, it is preferred that wafers can have a constant amount of precipitated oxygen. This is not limited to epitaxial wafers, and this is also the case when usual silicon substrates are subjected to a heat treatment for obtaining the gettering effect.

Further, the device fabrication process comprises various kinds of heat treatments, and an optimum amount of precipitated oxygen exists for each process (heat treatment). Inter alia, when the substrates are used as a substrate for epitaxial growth, it is very important to control the amount of precipitated oxygen for the following reason. That is, when the oxygen precipitation is little, the gettering effect becomes insufficient, and when it is too much, the substrates may be, for example, warped. Therefore, it is necessary to obtain an optimum amount of precipitated oxygen (precipitation amount).

In order to control oxygen precipitation characteristic during various heat treatments, it has conventionally been required to perform various controls during the pulling of single crystals to control the oxygen concentration, or perform heat treatment for a long period of time as for substrates.

Further, in the method disclosed in the aforementioned Japanese Patent Application Laid-open (KOKAI) No. 3-77330, the atmospheric gas for the heat treatment is limited to nitrogen, and the heat treatment time is long, i.e., 15 minutes. Moreover, it requires formation of an oxide film for preventing out-diffusion of nitrogen impurities before the heat treatment, and therefore it utilizes an increased number of process steps. Furthermore, because it relies on cooling method by taking substrates out from the heat treatment furnace, it suffers a drawback of difficult handling.

Although the aforementioned method may uniformalize the precipitation amount varying depending on the location in crystals to some extent, it does not control the precipitation amount itself. Thus, it is important to control the amount of precipitated oxygen for the many heat treatment steps, and it is required to produce a silicon substrate containing precipitation nuclei in a desired amount, from which the precipitates are formed. Further, the precipitation amount must be made uniform as for substrates having different oxygen concentrations, and it is desired to develop a method capable of, for example, affording a sufficient precipitation amount even for a wafer of low oxygen concentration, and controlling the amount of precipitated oxygen (oxygen precipitation nuclei) itself.

SUMMARY OF THE INVENTION

Accordingly, the present invention has been accomplished to solve these problems, and its major object is to provide a method for heat treatment of a silicon substrate produced by the CZ method for obtaining a silicon substrate having a desired oxygen precipitation characteristic without controlling oxygen concentration in the silicon substrate, wherein the heat treatment is performed by a rapid thermal annealer (also referred to as RTA apparatus hereinafter), and an epitaxial wafer utilizing a substrate heat-treated by the method.

To achieve the object, the present invention provides a method for heat treatment of a silicon substrate produced by the Czochralski method by utilizing a rapid thermal annealer, characterized in that the heat treatment is performed under an atmosphere composed of 100% nitrogen, or 100% oxygen, or a mixed atmosphere of oxygen and nitrogen by heating the silicon substrate to a maximum holding temperature within a range of from 1125° C. to the melting point of silicon, and holding the substrate at that maximum holding temperature for a holding time of 5 seconds or more, and then the substrate is rapidly cooled at a cooling rate of 8° C./second or more from the maximum holding temperature.

The aforementioned method can provide a silicon substrate having a desired oxygen precipitation characteristic without controlling oxygen concentration in the silicon substrate produced by the CZ method with high productivity at a low cost through a relatively easy process.

In the aforementioned method, it is desirable that, before and after the heat treatment by the rapid thermal annealer (also referred to as RTA treatment hereinafter), inside of the annealer is completely substituted with nitrogen atmosphere.

If the inside of the annealer is sufficiently substituted with nitrogen gas as described above, a film of unknown composition (oxide film and/or nitride film) having a thickness of 20–40 Å is formed on the silicon substrate immediately after the RTA treatment, and thus the oxygen precipitation characteristic can stably be controlled.

In the aforementioned method, an amount of oxygen precipitation nuclei in the substrate can be controlled by changing the maximum holding temperature and the holding time.

By performing the method in such a manner as mentioned above, a silicon substrate having a desired oxygen precipitation characteristic can be obtained with high productivity at a low cost through a relatively easy process. The obtained substrate can be subjected to an oxygen precipitation heat treatment to produce a silicon substrate containing a desired amount of oxide precipitates.

In the aforementioned method, the amount of oxygen precipitation nuclei in the substrate may be controlled by keeping the holding time constant, and changing the maximum holding temperature, or the amount of oxygen precipitation nuclei in the substrate may be controlled by keeping the maximum holding temperature constant, and changing the holding time.

By controlling the amount of oxygen precipitation nuclei in such a manner as described above, a silicon substrate having an accurate desired oxygen precipitation characteristic can be obtained with high productivity and yield at a low cost through a relatively easy process. The obtained substrate can be subjected to an oxygen precipitation heat treatment to produce a silicon substrate containing a desired amount of precipitated oxygen and having high gettering ability.

The present invention also provides a silicon substrate which has been heat-treated by the aforementioned method for heat treatment (RTA treatment) of the present invention. Such a wafer would have a desired oxygen precipitation characteristic.

The present invention further provides a silicon substrate which has been heat-treated by the aforementioned method for heat treatment of the present invention, wherein content of oxygen precipitation nuclei of the substrate is controlled so that uniform oxide precipitates should be formed after the heat treatment. That is, in the above silicon substrate, a desired amount of precipitated oxygen can be obtained during the oxygen precipitation heat treatment or a heat treatment in the device fabrication process after the RTA treatment, even though the oxygen concentration in the substrate is not controlled. This silicon substrate is imparted with desired internal gettering ability, and is extremely useful for semiconductor devices.

The present invention further provides a silicon substrate which has been heat-treated by the aforementioned method for heat treatment of the present invention, and has an oxygen concentration in the substrate of 14 ppma or less, and a bulk defect density of $3\times10^9$ defects/cm$^3$ or more. This silicon substrate heat-treated by the aforementioned method is a novel silicon substrate that can have nuclei from which oxide precipitates are formed, i.e., oxygen precipitation nuclei, in an amount of $3\times10^9$ defects/cm$^3$ or more represented in terms of density of oxide precipitates as bulk defects, which satisfy the level required for gettering sites, even though, in particular, it has a low oxygen concentration, i.e., 14 ppma (JEIDA) or less.

The oxygen concentration referred to in the present invention is determined by infrared spectroscopy based on the conversion factors that are employed by JEIDA (Japan Electronic Industry Development Association).

The present invention still further provides an epitaxial wafer which comprises an epitaxial film grown on a silicon substrate heat-treated by the aforementioned method for heat treatment of a silicon substrate of the present invention. Because a silicon wafer subjected to the heat treatment of the present invention uniformly contains the precipitation nuclei in a desired amount, by growing an epitaxial film on such a silicon wafer, an epitaxial wafer undergone oxygen precipitation sufficient for gettering sites can be obtained. This epitaxial wafer is extremely useful for semiconductor devices.

According to the present invention, a silicon substrate having a desired oxygen precipitation characteristic can be obtained by changing the holding temperature and/or the holding time in the high temperature heat treatment utilizing a rapid thermal annealer without controlling the oxygen concentration in silicon substrates produced by the CZ method. Therefore, the present invention eliminates the needs for complicated oxygen concentration control during the production of single crystals and subsequent oxygen precipitation heat treatment of substrates for a long period of time, and also eliminates the need of pre-treatment such as formation of oxide film before the heat treatment. Thus, yield and productivity can be improved.

In addition, the amount of the oxygen precipitation nuclei itself can finely-be controlled, and therefore a substrate having an amount of oxygen precipitation nuclei corresponding to a specific device fabrication process can be produced. Such a substrate is a silicon substrate extremely useful also as an epitaxial substrate.

DESCRIPTION OF THE INVENTION AND EMBODIMENTS

Embodiments of the present invention will be explained hereinafter with reference to the appended drawings, but the present invention is not limited to these.

Because it was known that heat treatment comprising rapid heating and rapid cooling under nitrogen atmosphere applied to a silicon substrate produced by the CZ method could enhance oxygen precipitation, the inventors of the present invention attempted to utilize this principle in the production of substrates having a constant precipitation amount regardless of the contained oxygen concentration, and further conducted studies and experiments about the atmospheric gas. As a result, the inventors of the present invention found that this phenomenon was observed not only in the RTA treatment under nitrogen atmosphere, but also in a similar treatment under oxygen atmosphere or a mixed atmosphere composed of oxygen and nitrogen. The inventors of the present invention further investigated various conditions therefor, and thus completed the present invention.

An apparatus used for the present invention, which is capable of rapid heating and rapid cooling of a silicon substrate, will be explained first. As such an apparatus, i.e., a rapid thermal annealer, those apparatuses utilizing heat radiation such as lamp heater can be mentioned. Commercially available apparatuses such as SHS-2800 made by AST Co., Ltd. can also be used, and those are not so complicated and expensive.

Figure 1:
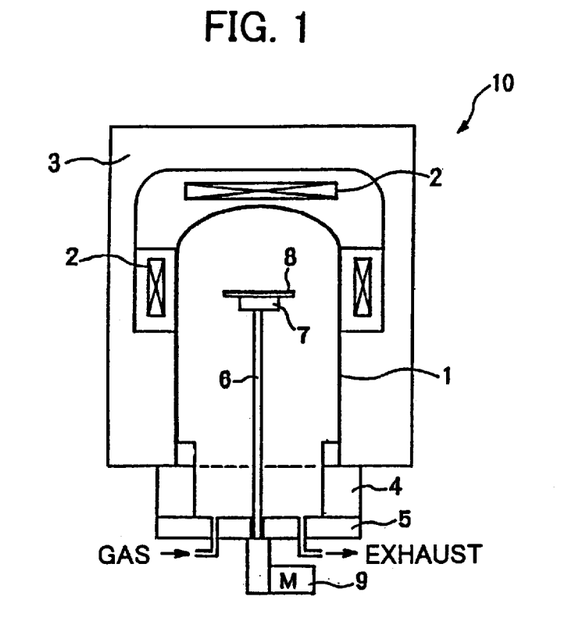
FIG. 1 represents a schematic cross-sectional view of a rapid thermal annealer.

An exemplary RTA apparatus used for the present invention will be explained. FIG. 1 represents a schematic cross-sectional view of an RTA apparatus.

The heat treatment apparatus 10 shown in FIG. 1 comprises a bell jar 1 composed of, for example, silicon carbide or quartz, and a wafer is heat-treated in this bell jar 1. Heating is performed by heaters 2, which are disposed so that they should surround the bell jar 1. These heaters constitute a top part and a lateral part, and electric power supplied to them can be independently controlled. Of course, the heating mechanism is not limited to this, and the so-called radiant heating, high-frequency heating and the like may also be used. A housing 3 for shielding heat is disposed outside the heaters 2.

A water cooled chamber 4 and a base plate 5 are disposed under a furnace, and they shut the inside of the bell jar 1 off from the outer air. A wafer 8 is held on a stage 7, and the stage 7 is fixed at the top of supporting shaft 6, which can be freely moved upward and downward by a motor 9. The water cooled chamber 4 has a wafer insertion port (not shown in the figure) which can be opened and closed by a gate valve, so that the wafer can be put into and taken out from the furnace along the transverse direction. The base plate 5 is provided with a gas inlet and exhaust outlet, so that the gaseous atmosphere in the furnace can be controlled.

Figure 2:
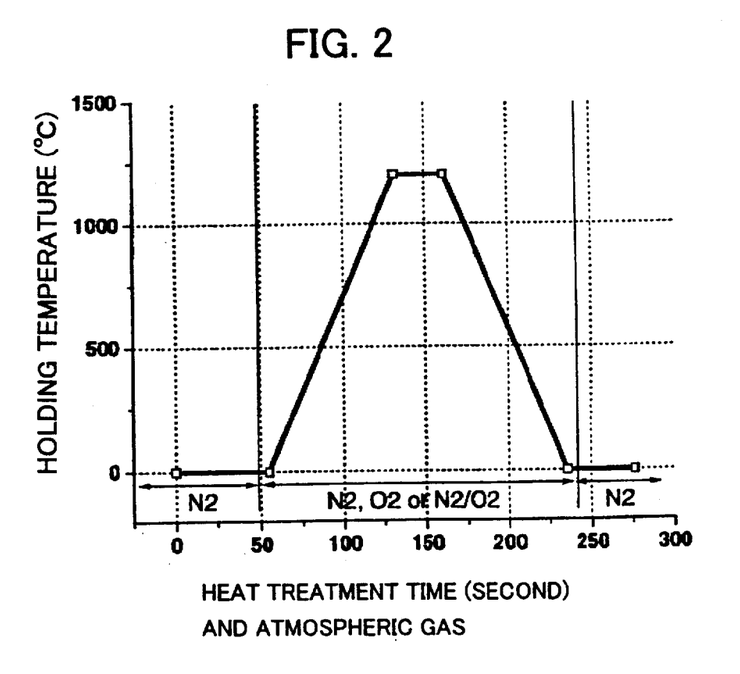
FIG. 2 is a diagram representing an RTA treatment process.

By using such a heat treatment apparatus 10 as mentioned above, the RTA treatment for rapid heating and rapid cooling of silicon substrate is performed as follows. An example of heat treatment process according to the present invention is shown in FIG. 2.

First, a silicon wafer is inserted from the insertion port of the water cooled chamber 4 by a wafer handling apparatus not shown in the figure, which is disposed at a neighboring position of the heat treatment apparatus 10, and placed on the stage 7 waiting at its lowest position via, for example, a SiC boat. At this point, the inside of the furnace is sufficiently purged with nitrogen.

After sufficiently purged with nitrogen gas (10 seconds or more, 55 seconds in the example shown in FIG. 2), the atmospheric gas is substituted with 100% nitrogen, 100% oxygen, or a mixed gas of oxygen and nitrogen, and temperature gradient of, for example, 500–1250° C., is formed by the heaters 2 in the bell jar 1. By independently controlling the electric power supplied to each of the separate heaters, temperature gradient can be obtained in the bell jar 1 along its height direction. Therefore, the heat treatment temperature can be selected by changing the position of the stage 7, i.e., the length of the supporting shaft 6 inserted into the furnace. After a desired temperature gradient is obtained in the inside of the bell jar 1, the stage 7 is moved for rapid heating at high temperature. The rate of temperature increase for this is about 50° C./second, but the rate of temperature increase is not limited to such a sequence. This rise in temperature may be temporally stopped at a temperature around 600° C. for several tens of seconds in order not to impart thermal shock to the wafer. A higher rate of temperature increase is more preferred in terms of the productivity.

Then, the heat treatment step is started. The silicon wafer 8 on the stage 7 is elevated to a position of a desired temperature within a range of, for example, 1125° C. to the melting temperature of silicon (1200° C. in FIG. 2), and held at the position for a desired period of time (5 seconds or more, 30 seconds in FIG. 2). By this procedure, the wafer can be subjected to high temperature heat treatment for the holding time. When the predetermined time has passed and the high temperature heat treatment was finished, the stage 7 is immediately descended by pulling the supporting shaft 6 out from the furnace by the motor 9, and positioned at the bottom of the water cooled chamber 4. Because the water cooled chamber 4 and the base plate 5 are cooled with water, the wafer on the stage 7 is cooled rapidly. When it is cooled to approximately ambient temperature, nitrogen gas substitution is performed again, and the wafer is finally taken out by the wafer handling apparatus to finish the RTA treatment.

When additional silicon wafers are to be heat-treated, those silicon wafers can be introduced successively into the apparatus and subjected to the heat treatment, since the temperature in the RTA apparatus 10 is not lowered.

The performed experimental process based on which the RTA treatment conditions of the present invention have been established will be explained hereinafter. First, the relationship between the conventionally utilized heat treatment conditions and amount of precipitated oxygen was investigated, and experiments were repeated to establish the heat treatment conditions for controlling the amount of oxygen precipitation nuclei as will be explained below.

(Test 1)

The factor investigated first was the heat treatment atmosphere. Influence of the atmospheric gas on the amount of oxygen precipitation nuclei in a silicon substrate was determined by using substrates of electroconductive P type having a diameter of 8 inches, crystal orientation of <100>, and initial oxygen concentration of 16 ppma (JEIDA).

The experiments were performed with an atmospheric gas composed of 100% hydrogen, 100% argon, hydrogen/argon mixed gas, 100% oxygen, or 100% nitrogen. As a heat treatment apparatus, a rapid thermal annealer was used considering productivity, operability, and experimental precision. As the rapid thermal annealer, SHS-2800 made by AST Co., Ltd. was used. In the heat treatment, the holding temperature and holding time were fixed to 1200° C. and 30 seconds, respectively, and the cooling rate was fixed to 33° C./second.

Figure 3:
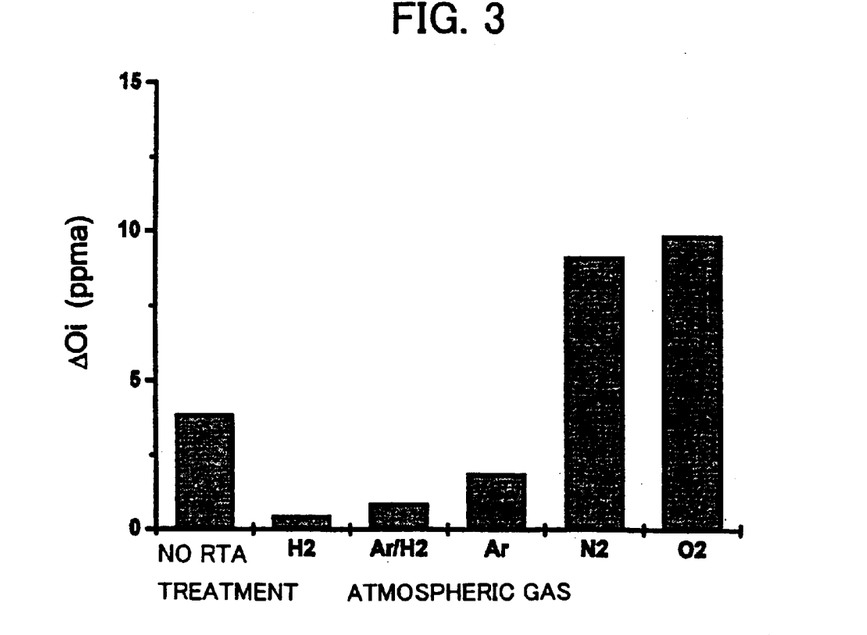
FIG. 3 is a graph representing the relationship between the kind of the atmospheric gas in the RTA treatment and the amount of precipitated oxygen.

The results are shown in FIG. 3. It can be seen that the oxygen precipitation was very little when the atmospheric gas was 100% hydrogen, 100% argon, or a mixed gas thereof. On the other hand, the amount of precipitated oxygen became large with 100% oxygen, or 100% nitrogen.

When the amount of precipitated oxygen is adjusted to an optimum amount, a larger precipitation amount is easier to be adjusted, and therefore it is preferable to use an atmosphere composed of 100% oxygen, or 100% nitrogen.

(Test 2)

Then, influence of the mixing ratio of oxygen/nitrogen mixed gas was determined by varying the mixing ratio. The silicon substrates used were equivalent to those used in the above Test 1. The heat treatment was performed with fixed holding temperature and holding time of 1150° C. and 30 seconds, respectively, and fixed cooling rate of 33° C./second.

Figure 4:
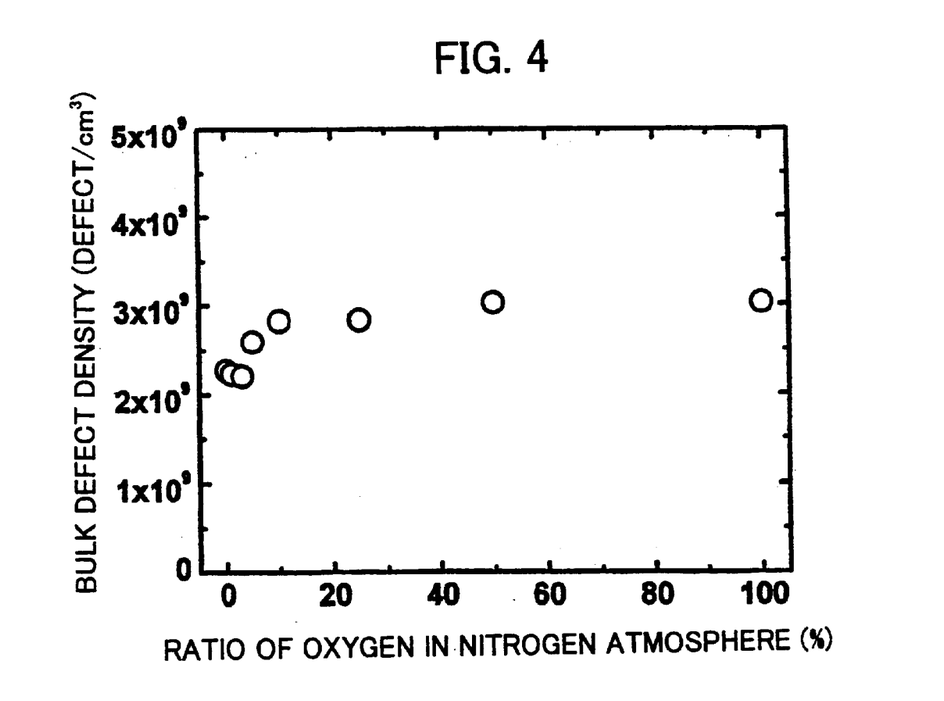
FIG. 4 is a graph representing the relationship between the ratio of oxygen in nitrogen atmosphere in the RTA treatment and bulk defect density (oxide precipitate density).

The results are shown in FIG. 4. The oxide precipitate density was substantially constant regardless of the kind of the atmosphere in the RTA apparatus, i.e., nitrogen, oxygen or a mixed gas thereof. In particular, when several % or more of oxygen was mixed, the oxygen precipitation was more promoted, and more stable precipitation was obtained compared with the atmosphere of 100% nitrogen. In addition, a mixed gas is easier to handle and safer.

The results shown in FIGS. 3 and 4 are those concerning the amount of precipitated oxygen and the oxide precipitate density obtained for substrates subjected to an oxygen precipitation heat treatment (referred to as precipitation heat treatment hereinafter) of 800° C./4 hours+1000° C./16 hours after the heat treatment by the RTA apparatus.

When only the heat treatment by the RTA apparatus according to the present invention was performed, the nuclei which determine the precipitation amount were formed, but they were not precipitated in a detectable size, and hence they cannot be detected. Therefore, the precipitation heat treatment was performed to grow the precipitation nuclei in the substrates, which were formed by the treatment according to the present invention. This precipitation heat treatment is not limited to the above temperature condition, and substantially similar results can be obtained by various heat treatments such as those performed in the device fabrication process.

The amount of precipitated oxygen shown in FIG. 3 was obtained as a difference of interstitial oxygen concentrations before and after the heat treatment, which concentrations were measured by infrared spectroscopy using QS-300 made by BioRad. The measurement was performed for 3 points, the center of substrate, a point at a distance of R/2 from the center (R: radius of substrate), and a point at a distance of 20 mm from the periphery along the radial direction.

The bulk defect density shown in FIG. 4 was determined by infrared interferometry for the same three points as those for the amount of precipitated oxygen. The measurement was performed with an OPP (Optical Precipitate Profiler) made by BioRad.

The measurement was performed for a region having a depth of 90 $\mu$m from the surface towards the inside. The bulk defect density obtained by this measurement represents density of oxide precipitates or stacking faults, most of which are fine oxide precipitates that may be the nuclei of oxygen precipitation.

(Test 3)

Then, a method for controlling the amount of oxygen precipitation nuclei in a substrate by varying the maximum holding temperature was experimented.

The heat treatment was performed for silicon substrates of electroconductive P type having a diameter of 8 inches and crystal orientation of <100>by an RTA apparatus under a mixed gas atmosphere of 3% oxygen/nitrogen, 100% nitrogen atmosphere, or 100% oxygen atmosphere.

The initial oxygen concentration of the substrates was 16 ppma.

The substrates were each heat-treated at one of 6 levels of the maximum holding temperature, 1050° C., 1100° C., 1150° C., 1175° C., 1200° C., and 1225° C.

The heat treatment holding time and the cooling rate in the RTA apparatus were fixed to constant values, 30 seconds and 33° C./second, respectively. In this Test 3, the oxygen precipitation heat treatment same as that of Test 1 was also performed after the heat treatment by the RTA apparatus.

Figure 5:
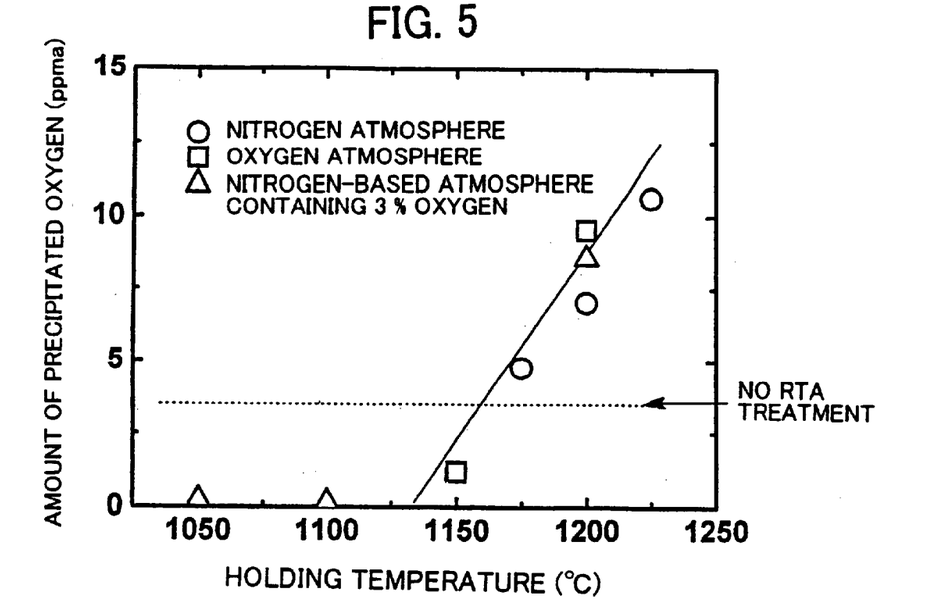
FIG. 5 is a graph representing the relationship between the holding temperature in the RTA treatment and the amount of precipitated oxygen.

The results are shown in FIG. 5. As clearly seen from the results shown in this figure, when a constant holding time was used in the heat treatment by RTA apparatus, the amount of precipitated oxygen depended only on the holding temperature in the range of 1125° C. or higher. In the range below 1125° C., the precipitation nuclei were not formed. The amount of precipitated oxygen level indicated with the dotted line was obtained from evaluation of a sample of the same specification that was not subjected to the RTA treatment, but subjected to the precipitation heat treatment.

Thus, by selecting a maximum holding temperature of 1125° C. or higher, an arbitrary value of the amount of precipitated oxygen can be selected for substrates having a constant oxygen concentration. That is, it was demonstrated that, by selecting a maximum holding temperature in the RTA treatment of 1125° C. or higher, the amount of precipitated oxygen can be adjusted to a desired value in the above atmosphere.

(Test 4)

Similar control can also be possible by changing the holding time in the RTA treatment. The following heat treatment was performed by an RTA apparatus. The heat treatment was performed in nitrogen atmosphere. The initial oxygen concentration of substrates was 16 ppma. The amount of precipitated oxygen of the substrates was controlled by varying the holding time, i.e., by using a holding time of 10, 20 or 30 seconds, at a maximum holding temperature of 1200° C. Also in this case, the precipitation heat treatment same as that of Test 1 was performed after the RTA treatment of the present invention.

Figure 6:
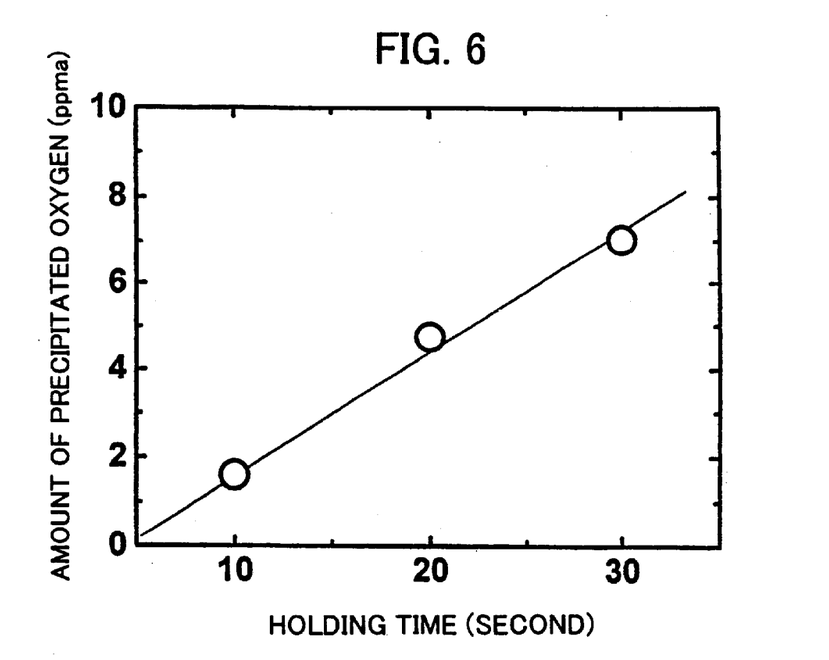
FIG. 6 is a graph representing the relationship between the holding time in the RTA treatment and the amount of precipitated oxygen.

FIG. 6 represents the relationship between the holding time in the RTA treatment and the amount of precipitated oxygen after the precipitation heat treatment, and demonstrates that a longer holding time afforded a more increased amount of precipitated oxygen. That is, the amount of precipitated oxygen can be controlled by using a fixed holding temperature of 1125° C. or higher, and varying the holding time in the RTA treatment.

It is considered that, in order to control the amount of precipitated oxygen at such a holding temperature, the holding time is desirably, but not particularly limited to, 5 seconds or more in view of the limitation of the RTA apparatus as a heat treatment apparatus. On the other hand, heat treatment for a long period of time increases the density of the precipitation nuclei, and therefore heat treatment of unduly long period of time generates very fine precipitation nuclei at a high density. Such fine precipitation nuclei disappear during the subsequent precipitation heat treatment, and hence ultimate oxygen precipitation is suppressed to such an extent that it cannot be controlled. Therefore, the holding time is preferably 10 minutes or less for the reason arisen from the apparatus, and more preferably 2 or 3 minutes or less.

(Test 5)

Influence of the cooling rate on the amount of precipitated oxygen in the present invention was examined.

The heat treatment was performed for silicon substrates of electroconductive P type having a diameter of 8 inches and crystal orientation of <100>by an RTA apparatus. The heat treatment was performed under nitrogen atmosphere. The initial oxygen concentration of the substrates was 16 ppma.

The substrates were each heat-treated at a maximum holding temperature of 1200° C. for a holding time of 30 seconds with a varying cooling rate, 8, 15 or 33° C./second. The oxygen precipitation heat treatment same as that of Test 1 was performed after the heat treatment by the RTA apparatus also in this experiment.

Figure 7:
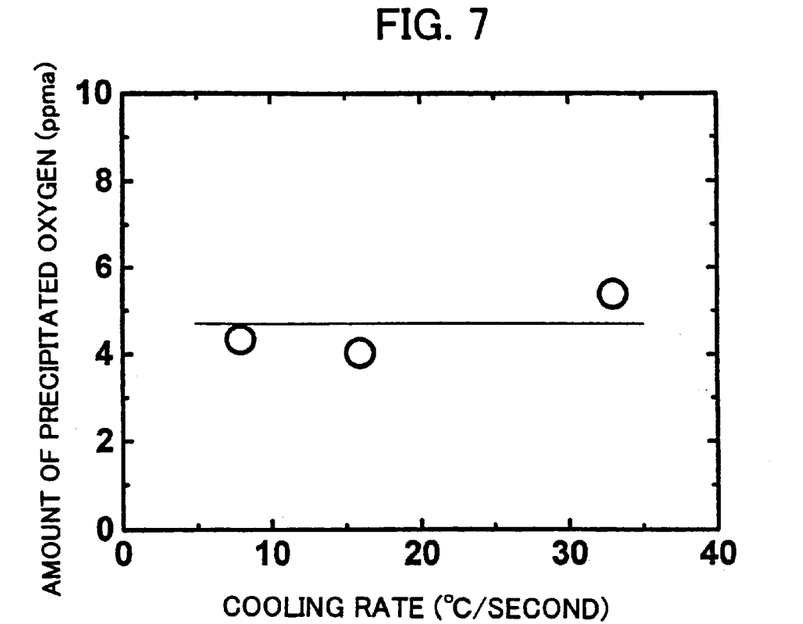
FIG. 7 is a graph representing the relationship between the cooling rate in the RTA treatment and the amount of precipitated oxygen.

The relationship between the cooling rate during the RTA treatment and the amount of precipitated oxygen is shown in FIG. 7. As seen from the results shown in this figure, the amount of precipitated oxygen did not depend on the cooling rate. However, a cooling rate of 8° C./second or higher is desirable because a shorter heat treatment time is preferred.

(Test 6)

An example of control of the amount of precipitated oxygen (aimed oxide precipitate density, $1 \times 10^{10}$ defects/$cm^3$) by varying the oxygen concentration in wafers to be subjected to the heat treatment will be shown below.

Substrates having an oxygen concentration of 12, 13, 15, or 17 ppma were heat-treated with conditions of a maximum holding temperature of 1200° C., a holding time of 30 seconds, and a cooling rate of 33° C./second under 100% oxygen atmosphere. The oxygen precipitation heat treatment same as that of Test 1 was performed after the heat treatment by the RTA apparatus also in this experiment.

Figure 8:
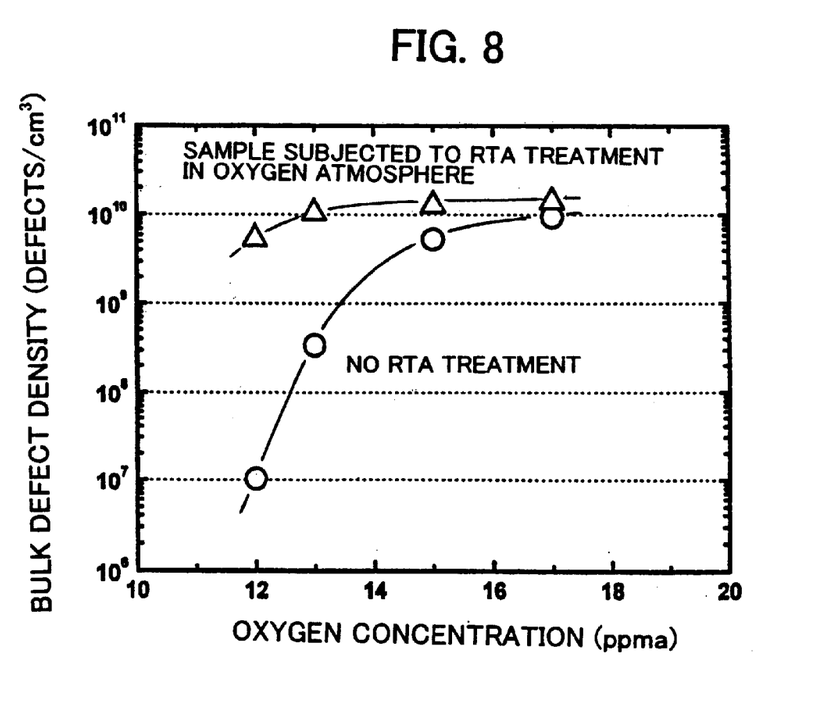
FIG. 8 is a graph representing the relationship between the initial oxygen concentration in a substrate in the RTA treatment and bulk defect density (oxide precipitate density).

The relationship between the initial oxygen concentration in the substrate and the oxide precipitate density therein after the precipitation heat treatment is shown in FIG. 8. When the RTA treatment was omitted, the bulk defect density (oxide precipitate density) greatly depended on the oxygen concentration, and insufficient precipitation amount was observed in the low oxygen concentration range. On the other hand, when the RTA treatment was performed under the oxygen atmosphere, the bulk defect density (oxide precipitate density) substantially did not depend on the initial oxygen concentration of the substrates. That is, it was demonstrated that, according to the present invention, it was not necessary to control the initial oxygen concentration of substrates in order to control the oxygen precipitation characteristic. Slight differences of precipitate density can finely be controlled by further controlling the holding time and the like. Further, wafers maintaining a bulk defect density (oxide precipitate density) of not less than $3 \times 10^9$ defects/$cm^3$ were obtained even with an initial oxygen concentration in wafers of 14 ppma or less. The oxygen concentration in the wafers before the precipitation heat treatment (after the RTA treatment) was almost the same as the initial oxygen concentration.

(Test 7)

Using silicon substrates that were subjected to the heat treatment of the present invention, epitaxial growth was performed. An epitaxial film was grown in a conventional manner on each of the substrates produced in Test 6 (not subjected to the precipitation heat treatment). Then, the bulk defect density (oxide precipitate density) on the substrates was determined. As a result, it was found that every substrate contained the precipitates at a level of $1 \times 10^{10}$ defects/$cm^3$, and thus oxygen precipitation sufficient for gettering sites has been produced in the substrate. The device fabrication process includes various heat treatment steps in addition to the epitaxial growth, and a suitable amount of precipitated oxygen is defined for each process step. Therefore, by preliminarily providing precipitation nuclei corresponding to such a suitable oxygen precipitation in a substrate through the heat treatment of the present invention, yields in subsequent steps can be improved.

In summary of the above-mentioned experiments and investigations, when oxygen precipitation nuclei are formed in a silicon substrate produced by the CZ method through a heat treatment by an RTA apparatus, a silicon substrate having a desired oxygen precipitation characteristic can be provided without controlling oxygen concentration in the silicon substrate produced by the CZ method with high productivity at a low cost through a relatively easy process, by performing the heat treatment under an atmosphere composed of 100% nitrogen, or 100% oxygen, or a mixed atmosphere of oxygen and nitrogen with heat treatment conditions of a maximum holding temperature within a range of from 1125° C. to the melting point of silicon, and a holding time of 5 seconds or more, and then rapidly cooling the substrate at a cooling rate of 8° C./second or more from the maximum holding temperature.

In the above process, it is desirable that, before and after the RTA treatment, the inside of the RTA apparatus is completely substituted with nitrogen atmosphere.

If the inside of the apparatus is sufficiently substituted with nitrogen as described above, a film of unknown composition having a thickness of 20–40 Å is formed on the silicon substrate immediately after the RTA treatment, and thus the oxygen precipitation characteristic can stably be controlled.

As for the aforementioned film, when a silicon substrate immediately after the RTA treatment was examined by an ellipsometer (elliptical polarization analyzer), there was confirmed formation of a film having a thickness of 20–40 Å, of which composition was indefinite, but which is considered to be a oxide film, or nitride film. However, formation of such a thick oxide film as disclosed in Japanese Patent Application Laid-open (KOKAI) No. 3-77330 (supra) was not confirmed. That film was formed during the rapid heating and the rapid cooling, and it is preferable to completely purge with nitrogen atmosphere before and after the heat treatment in order to maintain such a thickness and quality of the film.

When such a nitrogen purge is not performed, and oxygen atmosphere is employed before the heat treatment, an oxide film having a thickness of about 180 Å may be formed immediately after the heat treatment with similar RTA treatment conditions.

It has been known that, when an oxide film is formed on a silicon surface, interstitial silicons are generally introduced into the inside of the silicon, and these interstitial silicons inhibit oxygen precipitation. Therefore, when a film formed by the RTA treatment becomes too thick, it may inhibit the oxygen precipitation. Accordingly, for the control of the oxygen precipitation, the film formed on the silicon surface preferably has a thickness of 20–40 Å.

The most characteristic feature of the present invention is that the amount of the oxygen precipitation nuclei in a silicon substrate can be adjusted to a desired amount by varying the maximum holding temperature and the holding time in the RTA treatment without controlling the oxygen concentration in the substrate.

By this future, the need of controlling the oxygen incorporated in crystals, for example, during the process of the CZ method is eliminated, and a silicon substrate having a desired oxygen precipitation characteristic can be produced with high productivity at a low cost through a relatively easy process. In addition, a silicon substrate having a desired amount of oxide precipitates can be produced by subjecting the above substrate to the precipitation heat treatment.

The amount of oxygen precipitation nuclei in the substrate may be controlled either by keeping the holding time constant, and changing the maximum holding temperature, or by keeping the maximum holding temperature constant, and changing the holding time.

As described above, the silicon substrate subjected to the RTA treatment according to the RTA treatment method of the present invention is a silicon substrate whose content of oxygen precipitation nuclei is controlled so that uniform oxide precipitates should be formed after the precipitation heat treatment. Besides, a substrate having a desired uniform amount of precipitated oxygen can be obtained by subjecting it to the precipitation heat treatment after the RTA treatment, even though the oxygen concentration contained in the silicon substrate is not controlled.

Furthermore, the epitaxial wafer obtained by growing an epitaxial film on a silicon substrate subjected to the heat treatment of the present invention is an epitaxial wafer having oxygen precipitation sufficient for gettering sites, and therefore it is extremely useful for the semiconductor device fabrication. The device fabrication process includes various heat treatment steps in addition to the epitaxial growth, and a suitable amount of precipitated oxygen may be defined for each process step. Therefore, by preliminarily providing precipitation nuclei corresponding to such a suitable amount of precipitated oxygen in a substrate through the heat treatment of the present invention, yields in subsequent steps can be improved.

The present invention is not limited to the embodiments described above. The above-described embodiments are mere examples, and those having the substantially same structure as that described in the appended claims and providing the similar functions and advantages are included in the scope of the present invention.

What is claimed is:

1. A silicon substrate which has an oxygen concentration in the substrate of 14 ppma or less, and a bulk defect density of $3 \times 10^9$ defects/cm$^3$ or more.

* * * * *